(12) United States Patent
Zhang

(10) Patent No.: US 11,063,190 B2
(45) Date of Patent: Jul. 13, 2021

(54) LIGHT-EMITTING DIODE PACKAGE COMPONENT

(71) Applicant: KAISTAR Lighting(Xiamen) Co., Ltd., Xiamen (CN)

(72) Inventor: Jing-Qiong Zhang, Xiamen (CN)

(73) Assignee: KAISTAR LIGHTING(XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/985,478

(22) Filed: Aug. 5, 2020

(65) Prior Publication Data

US 2020/0365773 A1  Nov. 19, 2020

(30) Foreign Application Priority Data

Aug. 28, 2019 (CN) .......................... 201910801792.5

(51) Int. Cl.
| | |
|---|---|
| *H01L 33/50* | (2010.01) |
| *H01L 33/56* | (2010.01) |
| *H01L 33/60* | (2010.01) |

(52) U.S. Cl.
CPC ............ *H01L 33/504* (2013.01); *H01L 33/56* (2013.01); *H01L 33/60* (2013.01)

(58) Field of Classification Search
CPC ..... H01L 33/56; H01L 33/504; H01L 33/508; H01L 33/60
See application file for complete search history.

(56) References Cited

U.S. PATENT DOCUMENTS

2014/0353704 A1\* 12/2014 Kamikawa .............. H01L 33/56
                                                                257/98

FOREIGN PATENT DOCUMENTS

| CN | 1838437 A | 9/2006 |
|---|---|---|
| CN | 1929158 A | 3/2007 |
| CN | 101026208 A | 8/2007 |
| KR | 1020080102757 A | 11/2008 |

\* cited by examiner

*Primary Examiner* — Karabi Guharay
(74) *Attorney, Agent, or Firm* — Li & Cai Intellectual Property (USA) Office

(57) ABSTRACT

A light-emitting diode package component is provided. The light-emitting diode package component includes a substrate, a light-emitting chip, a die attach adhesive, a reflective structure, and a molding layer. The light-emitting chip is disposed on the substrate for generating an initial light beam with an initial wavelength. The die attach adhesive is disposed between the light-emitting chip and the substrate so that the light-emitting chip is mounted on the substrate. The reflective structure defining an accommodating space is disposed on the substrate and surrounds the light-emitting chip. The molding layer is disposed in the accommodating space and covers the light-emitting chip. The die attach adhesive includes a first wavelength conversion material, a portion of the initial light beam entering into the die attach adhesive excites the first wavelength conversion material to produce an excitation light with a first wavelength that is greater than the initial wavelength.

16 Claims, 1 Drawing Sheet

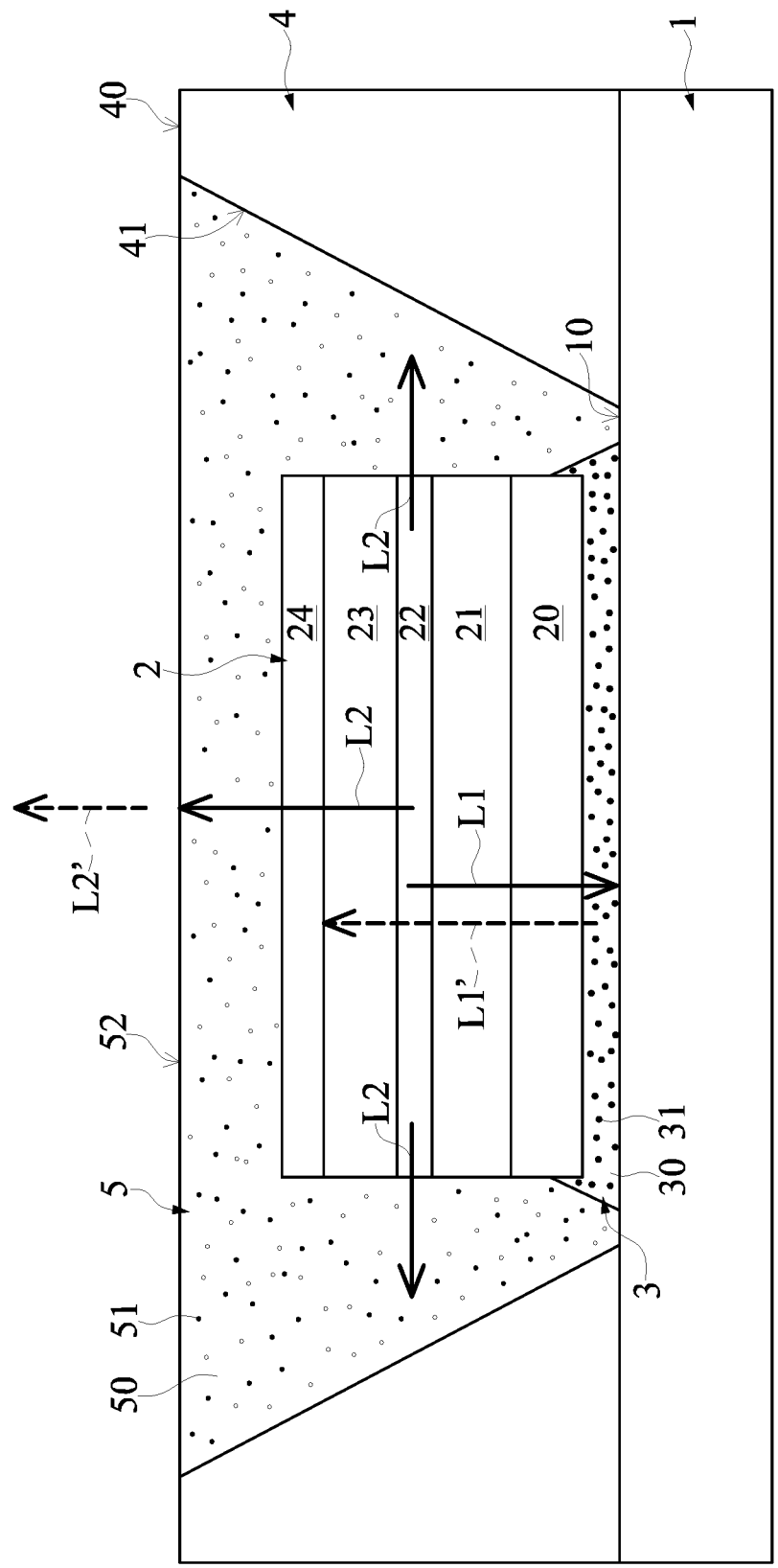

LIGHT-EMITTING DIODE PACKAGE COMPONENT

CROSS-REFERENCE TO RELATED PATENT APPLICATION

This application claims the benefit of priority to China Patent Application No. 201910801792.5, filed on Aug. 28, 2019 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting diode package component, and more particularly to a light-emitting diode package component with higher light extraction efficiency.

BACKGROUND OF THE DISCLOSURE

A light-emitting diode (LED) is one of semiconductor electronic devices and is capable of converting electrical energy to light energy. Since the LED has characteristics such as higher brightness, lower power consumption, longer lifetime, faster start-up, higher illumination efficiency, and no light flicker, and has the advantage of providing relief to visual fatigue, it has been widely used in a display apparatus or an illumination apparatus.

In the lighting industry, white light is the most commonly used light source. Accordingly, a blue light-emitting diode is usually operated with yellow phosphor or other mixed phosphor to produce white light. A conventional LED packaged device for producing white light usually includes a light-emitting chip and a fluorescent adhesive encapsulating the light-emitting chip.

However, a refractive index of the fluorescent adhesive, which is usually made of silicone, is less than that of the material (GaN) of the light-emitting chip. Therefore, when a light beam generated by the light-emitting chip emits from the light-emitting chip and enters into the fluorescent adhesive, a portion of the light beam may be totally reflected and then be lost. As such, a light extraction efficiency of the LED packaged device would be decreased. Therefore, the illumination apparatus applied with the conventional LED still has room for improvement in terms of the luminance and the light extraction efficiency thereof.

SUMMARY OF THE DISCLOSURE

In response to the above-referenced technical inadequacies, the present disclosure provides a light-emitting diode package component so as to reduce light loss caused by the difference between the refractive index of the light-emitting chip and the refractive index of the fluorescent adhesive, thereby improving the light extraction efficiency of the light-emitting diode package component.

In one aspect, the present disclosure provides a light-emitting diode package component including a substrate, a light-emitting chip, a die attach adhesive, a reflective structure, and a molding layer. The light-emitting chip is disposed on the substrate for generating an initial light beam with an initial wavelength. The die attach adhesive is disposed between the light-emitting chip and the substrate. The light-emitting chip is mounted on the substrate by the die attach adhesive. The reflective structure is disposed on the substrate and surrounds the light-emitting chip. The reflective structure defines an accommodating space. The molding layer is disposed in the accommodating space and covers the light-emitting chip. The die attach adhesive includes a first wavelength conversion material, a portion of the initial light beam that enters into the die attach adhesive excites the first wavelength conversion material to produce an excitation light with a first wavelength. The excitation light is reflected back to the light-emitting chip by the substrate and then enters into the molding layer, and the first wavelength is greater than the initial wavelength.

In certain embodiments, the molding layer includes a second wavelength conversion material, and another portion of the initial light beam that directly enters into the molding layer excites the second wavelength conversion material to output an emission light, and the emission light is a mixed light.

In certain embodiments, the first wavelength conversion material includes at least one of phosphor or quantum dots.

In certain embodiments, the excitation light is green light, and the first wavelength ranges from 515 nm to 570 nm. The die attach adhesive has a thickness ranging from 5 to 20 µm.

In certain embodiments, the light-emitting chip is a blue light-emitting chip, the initial wavelength ranges from 420 nm to 470 nm, and the first wavelength conversion material is selected from a group consisting of nitride phosphor, β-SiAlON phosphor, α-SiAlON phosphor, lutetium aluminum garnet (LuAG) phosphor, yttrium aluminum gallium garnet (GaYAG) phosphor, yttrium aluminum garnet (YAG) phosphor, lutetium and yttrium aluminum garnet (LuYAG) phosphor, and any combination thereof.

In certain embodiments, the light-emitting chip is a violet light-emitting chip, the initial wavelength ranges from 380 nm to 420 nm, and the first wavelength conversion material is selected from a group consisting of nitride phosphor, β-SiAlON phosphor, α-SiAlON phosphor, halophosphate phosphor, and any combination thereof. The die attach adhesive includes a matrix, the first wavelength conversion material is embedded in the matrix, and the matrix is made of methyl silicone resin.

In certain embodiments, a particle size of the first wavelength conversion material ranges from 5 µm to 20 µm.

In certain embodiments, the molding layer has a light emergent surface, and the light emergent surface is flush with a top surface of the reflective structure.

Therefore, in the light-emitting diode package component provided in the embodiment of the present disclosure, by virtue of "the die attach adhesive 3 including the first wavelength conversion material 31," the excitation light with a longer wavelength can be produced when the portion of the initial light beam enters the die attach adhesive and excites the first wavelength conversion material. As such, when the reflected excitation light enters into the molding layer from the light-emitting chip, it is less likely for the excitation light to suffer loss due to total internal reflection, such that the light extraction efficiency of the light-emitting diode package component can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 1 is schematic cross-sectional view of a light-emitting diode package component according to a first embodiment of the present disclosure.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a schematic cross-sectional view of a light-emitting diode package component according to a first embodiment of the present disclosure. The light-emitting diode package component M1 includes a substrate 1, a light-emitting chip 2, a die attach adhesive 3, a reflective structure 4, and a molding layer 5.

The substrate 1 has a reflective surface 10, and a die-bonding region is defined on the reflective surface 10. In one embodiment, the substrate 1 can be made of a material having a high thermal conductivity, and a high reflectivity and a low transmittance for visible light, such as metal or ceramic. In another embodiment, the substrate 1 can also include a high thermally conductive base and a reflective layer coated thereon. That is to say, as long as the substrate 1 is thermally conductive, and the surface of the substrate 1 for being disposed with the light-emitting chip 2 can reflect visible light, the material of the substrate 1 is not limited to being a single material or a composite material in the present disclosure.

In another embodiment, the substrate 1 can be a circuit board, in which a plurality of wires is configured so as to be electrically connected to an external control component. Accordingly, as long as the die-bonding region has a surface for light reflection, the type of the substrate 1 is not limited in the embodiments of the present disclosure.

The light-emitting chip 2 is disposed on the substrate 1 and arranged in the die-bonding region. The light-emitting chip 2 is used to generate an initial beam L1, L2 with an initial wavelength. To be more specific, the light-emitting chip 2 can be a blue light-emitting chip or a violet light-emitting chip. When the light-emitting chip 2 is the blue light-emitting chip, the initial beam L1, L2 is blue light, and the initial wavelength ranges from 420 nm to 470 nm. When the light-emitting chip 2 is the violet light-emitting chip, the initial beam L1, L2 is violet light, and the initial wavelength ranges from 380 nm to 420 nm.

In the instant embodiment, the light-emitting chip 2 at least includes a base material 20, and a first conductivity type semiconductor layer 21, an active layer 22, a second conductivity type semiconductor layer 23, and an electrode layer 24 that are sequentially arranged on the base material 20. The base material 20 can be, for example, a sapphire base material, and each of the first conductivity type semiconductor layer 21, the active layer 22, and the second conductivity type semiconductor layer 23 can be made of, for example, III-V compound semiconductor, such as gallium nitride or indium gallium nitride. The initial light beam L1, L2 is generated by the active layer 22, and a portion of the initial light beam L1 may travel toward the substrate 1, and then be reflected by the reflective surface 10 of the substrate 10. The other portions of the initial light beam L2 may emit out of the light-emitting chip 2 from a top surface or a side surface thereof.

It should be noted that the light-emitting chip 2 does not include any reflective layer located at the bottom thereof in the instant embodiment. However, in another embodiment, the light-emitting chip 2 can further include a reflective layer located under the base material 20. A portion of the initial light beam L1 projecting toward the substrate 1 may be allowed to pass the reflective layer. Accordingly, the type of the light-emitting chip 2 is not limited in the present disclosure.

The electrode layer 24 can be a transparent conductive film, such as indium tin oxide (ITO), so that the light-emitting chip 2 can be electrically connected to an external control device. In one embodiment, the light-emitting diode package component M1 can further include a plurality of bonding wires (not shown in FIG. 1). When the substrate 1 is a circuit board, the light-emitting chip 2 can be electrically connected to the substrate 1 through the bonding wires. In another embodiment, when the substrate 1 is a metal substrate or a ceramic substrate, and the reflective structure 4 includes a wiring layout for being electrically connected to the external control device, and the light-emitting chip 2 can be electrically connected to the wiring layout of the reflective structure 4 through the bonding wires.

The die attach adhesive 3 is disposed between the light-emitting chip 2 and the substrate 1. That is to say, the light-emitting chip 2 is fixed on the reflective surface 10 by the die attach adhesive 3. As shown in FIG. 1, a bottom portion of the light-emitting chip 2 is embedded in the die attach adhesive 3. That is to say, the die attach adhesive 3 covers a bottom surface and a portion of a side surface of the light-emitting chip 2.

In the instant embodiment, the die attach adhesive 3 includes a matrix 30 and a first wavelength conversion material 31 embedded in the matrix 30. A portion of the initial light beam L1 projecting toward the substrate 1 enters into the die attach adhesive 3 and then excites the first wavelength conversion material 31 so as to produce an excitation light L1' with a first wavelength, the first wavelength being greater than the initial wavelength.

In one embodiment, when the light-emitting chip 2 is a violet light-emitting chip, the matrix 30 can be made of an adhesive material having a structural formula that does not contain any one of the epoxy group or the phenyl group. As such, the matrix 31 can be prevented from degeneration caused by violet irradiation. To be more specific, when the light-emitting chip 2 is a violet light-emitting chip, the matrix 30 can be made of methyl silicone resin. As such, the service life and the reliability of the light-emitting diode package component M1 can be improved.

The first wavelength conversion material 31 includes at least one of phosphor or quantum dots. When the first wavelength conversion material 31 includes phosphor, the phosphor can be green phosphor or red phosphor, such as nitride phosphor, β-SiAlON phosphor, α-SiAlON phosphor, lutetium aluminum garnet (LuAG) phosphor, yttrium aluminum gallium garnet (GaYAG) phosphor, yttrium aluminum garnet (YAG) phosphor, lutetium and yttrium aluminum garnet (LuYAG) phosphor, halophosphate phosphor, or any combination thereof.

When the first wavelength conversion material 31 includes the quantum dots, the material of the quantum dots can be PbSe, CdSe, or $CsPbX_3$, in which X represents a halogen element, such as chlorine (Cl), bromine (Br), or iodine (I).

When the light-emitting chip 2 is a blue light-emitting chip, the first wavelength conversion material 31 can be selected from a group consisting of nitride phosphor, β-SiAlON phosphor, α-SiAlON phosphor, lutetium aluminum garnet (LuAG) phosphor, yttrium aluminum gallium garnet (GaYAG) phosphor, yttrium aluminum garnet (YAG) phosphor, lutetium and yttrium aluminum garnet (LuYAG) phosphor, and any combination thereof.

Furthermore, the excitation efficiency of aluminate phosphor, such as lutetium aluminum garnet (LuAG) phosphor, yttrium aluminum gallium garnet (GaYAG) phosphor, yttrium aluminum garnet (YAG) phosphor, and lutetium and yttrium aluminum garnet (LuYAG) phosphor, as excited by violet light is relatively lower. Accordingly, when the light-emitting chip 2 is a violet light-emitting chip, the first wavelength conversion material 31 may not be selected from aluminate phosphor. To be more specific, the first wavelength conversion material 31 may be selected from a group consisting of nitride phosphor, β-SiAlON phosphor, α-SiAlON phosphor, halophosphate phosphor, and any combination thereof.

It should be noted that in one exemplary embodiment, the first wavelength conversion material 31 is phosphor or quantum dots for producing single color light. In other words, the first wavelength conversion material 31 includes only one of the green phosphor (or quantum dots for producing green light) and the red phosphor (or quantum dots for producing red light).

For example, the first wavelength conversion material 31 may include one or more types of red phosphors so as to produce the excitation light L1' with the first wavelength falling within a range from 580 nm to 675 nm. To be more specific, the first wavelength conversion material 31 can include only one type of red phosphor to produce red light with a specific wavelength or can include more than two types of red phosphors to produce red light containing a plurality of beams respectively having different wavelengths. For example, the red light may contain two beams respectively having wavelengths of 620 nm and 630 nm.

That is to say, the excitation light L1' that is produced by the portion of the initial light beam L1 passing through the first wavelength conversion material 31 may include a plurality of beams respectively having different wavelengths, but a difference between any two of the wavelengths is less than 30 nm. In another embodiment, the first wavelength conversion material 31 can include one or more types of green phosphors or quantum dots to produce the excitation light L1' with the first wavelength falling within a range from 515 nm to 570 nm. In the embodiment of the present disclosure, compared to the red fluorescent power or quantum dots for producing the red light, the light-emitting diode package component M1 can have a better light extraction efficiency and higher luminance by using the green phosphor or quantum dots for producing the green light to serve as the first wavelength conversion material 31.

In one embodiment, when the first wavelength conversion material 31 is the green phosphor, the die attach adhesive 3 may include 100-300 wt % of the green phosphor to obtain a higher conversion efficiency. When the first wavelength conversion material 31 is the red phosphor, the die attach adhesive 3 may include 10-60 wt % of the red phosphor to obtain a higher conversion efficiency.

Furthermore, a particle size of the first wavelength conversion material 31 is smaller than 25 μm; preferably, the particle size of the first wavelength conversion material 31 can range from 5 μm to 20 μm.

It should be noted that in the embodiment of the present disclosure, the die attach adhesive 3 including the first wavelength conversion material 31 is not only used to convert the portion of the initial light beam L1 traveling toward the substrate 1 into the excitation light L1' with a longer wavelength, but also has a better thermal conductivity so at to conduct heat from the light-emitting chip 2 to the substrate 1. That is to say, the die attach adhesive 3 of the instant embodiment can effectively dissipate heat generated by the light-emitting chip 2.

Specifically, the die attach adhesive 3 is connected between the light-emitting chip 2 and the substrate 1. Therefore, a thickness of the die attach adhesive 3 may affect the heat dissipation for the light-emitting chip 2. In one embodiment, the die attach adhesive 3 interposed between the light-emitting chip 2 and the substrate 1 has a thickness ranging from 5 μm to 20 μm.

Reference is made to FIG. 1. The reflective structure 4 is disposed on the substrate 1. It should be noted that the reflective structure 4 surrounds the light-emitting chip 2 from the top view and define an accommodating space (not designated by any reference numeral). Furthermore, in the instant embodiment, the reflective structure 4 has a height relative to the substrate 1 that is greater than a thickness of the light-emitting chip 2. That is to say, a vertical distance between a top surface 40 of the reflective structure 4 and the reflective surface 10 of the substrate 1 is greater than that between a top surface of the light-emitting chip 2 and the reflective surface 10 of the substrate 1.

Furthermore, an inner side surface 41 of the reflective structure 4 is inclined relative to a normal direction of the reflective surface 10. In other words, the inner side surface 41 of the reflective structure 4 is a slope so as to reflect and guide light toward a specific direction. Accordingly, the reflective structure 4 can be made of a material having a high reflectivity and a low transmittance for visible light, such as metal. However, as long as the inner side surface 41 of the reflective structure 4 is capable of reflecting visible light, the material of the reflective structure 4 is not limited in the present disclosure.

Further referring to FIG. 1, the molding layer 5 is disposed in the accommodating space defined by the reflective structure 4 and covers the light-emitting chip 2. In the instant embodiment, the molding layer 5 has a light emergent surface 52, and the light emergent surface 52 is flush with the top surface 40 of the reflective structure 4.

In addition, the molding layer 5 includes a main substance 50 and a second wavelength conversion material 51. The main substance 50 can be methyl silicone resin or methyl phenyl silicone resin. It is not necessary for the main substance 50 of the molding layer 5 and the matrix 30 of the die attach adhesive 3 to be made of the same material.

In one embodiment, the second wavelength conversion material 51 includes green phosphor and red phosphor. Accordingly, the emission light L2' is a mixed light, such as white light. The types of red and green phosphors have been described in previous descriptions, and will not be reiterated herein. In another embodiment, when the light-emitting chip 2 is a blue light-emitting chip, the second wavelength conversion material 51 can include yellow phosphor, but the present disclosure is not limited thereto.

Another portion of the initial light beam L2 entering into the molding layer 5 from the light-emitting chip 2 would excite the second wavelength conversion material 51 to output a emission light L2'. Specifically, the another portion of the initial light beam L2 generated by the light-emitting chip 2 enters into the molding layer 5 from a lateral surface or the top surface of the light-emitting chip 2 and excites the second wavelength conversion material 51.

Accordingly, a portion of the initial light beam L1 traveling toward the substrate 1 enters into the die attach adhesive 3 from the bottom surface of the base material 20, and then is adsorbed by the first wavelength conversion material 31 so as to produce the excitation light L1' with the longer first wavelength. The excitation light L1' may be reflected by the reflective surface 10 and travel back into the light-emitting chip 2 again. Thereafter, the first excitation incident light L1' may pass through the light-emitting chip 2 and then enter into the molding layer 5 from the top surface or the lateral surface of the light-emitting chip 2.

It should be noted that based on experiment results, when light enters into the molding layer 5 from the light-emitting chip 2, a smallest incidence angle (i.e., a critical angle) required to produce total internal reflection of light with a longer wavelength is greater than that required to produce total internal reflection of light with a shorter wavelength.

Since the initial wavelength of the initial light beam L1, L2 is less than the first wavelength of the excitation light L1', compared to the initial light beam L1, L2, the critical angle required to produce total internal reflection of the excitation light L1' is relatively greater as the excitation light L1' enters into the molding layer 5 from the light-emitting chip 2. That is to say, compared to the initial light beam L1, L2, the excitation light L1' is less likely to suffer loss from total internal reflection.

Accordingly, by converting the portion of the initial light beam L1 traveling toward the substrate 1 into the excitation light L1' with the longer first wavelength, the light loss can be effectively decreased, thereby enhancing the light extraction efficiency of the light-emitting diode package component M1. The aforementioned light extraction efficiency (E) means a percentage of a ratio of the luminance ($L_B$) measured after the molding layer 5 is disposed to the luminance ($L_A$) measured before the molding layer 5 is disposed. The light extraction efficiency (E) can be represented as the following equation: $E=(L_B/L_A)*100\%$.

Reference is made to table 1, which shows the differences among the luminance of each of the examples A, B of the present disclosure and the luminance of comparative example. The molding layers 5 used in the comparative example and the two examples A, B include the same material, and the light-emitting chips 2 used in the comparative example and the two examples A, B have the same specification. However, in the light-emitting diode package component of the comparative example, the die attach adhesive does not include any wavelength conversion material. In the light-emitting diode package components of the examples A, B, the die attach adhesives of the examples A, B respectively include green phosphor and red phosphor to serve as the first wavelength conversion material 31.

TABLE 1

| Examples | luminance |
| --- | --- |
| comparative example (the die attach adhesive does not include any phosphor or quantum dot) | 100% |
| example A (using the die attach adhesive including green phosphor) | 105.8% |
| example B (using the die attach adhesive including red phosphor) | 104.7% |

After the luminance of the comparative example is defined as 100% to normalize the luminance of the example A and the luminance of the example B, as shown in table 1, both the luminance of the example A and the luminance of the example B are improved, with the light-emitting diode package component of the example A having the greatest luminance. It is worth mentioning that compared to the excitation light (red light) produced by the light-emitting diode package component of the example B, the excitation light (green light) produced by the light-emitting diode package component of the example A has a shorter wavelength, but the luminance (or light extraction efficiency) of the example A is higher than that of the example B. It is therefore apparent that, when the first wavelength conversion material 31 includes the green phosphor, the result of the light extraction efficiency is beyond the expectations of one having ordinary skill in the art.

However, the aforementioned description for the light-emitting diode package component of the first embodiment is merely an example and is not meant to limit the scope of the present disclosure.

In conclusion, in the light-emitting diode package component provided in the embodiment of the present disclosure, by using "the die attach adhesive 3 including the first wavelength conversion material 31," the excitation light L1' with a longer wavelength can be produced when the portion of the initial light beam L1 enters the die attach adhesive 3 and excites the first wavelength conversion material 31. As such, when the reflected excitation light L1' enters into the molding layer 5 from the light-emitting chip 2, it is less likely for the excitation light L1' to suffer loss due to total internal reflection, such that the light extraction efficiency of the light-emitting diode package component M1 can be improved.

Moreover, when the light-emitting chip 2 is a violet light-emitting chip and operated in a humid or moist environment, the violet light generated by the violet light-emitting chip may result in migration of the metal atoms of the substrate 1, which may decrease the reliability of the light-emitting diode package component M1. Accordingly, by using the die attach adhesive 3 including the first wavelength conversion material 31 to produce the excitation light L1' with a longer wavelength, the aforementioned problem can be prevented.

Additionally, by modifying the particle size of the first wavelength conversion material 31 of the die attach adhesive 3 and the thickness of the die attach adhesive 3, the die attach adhesive 3 of the embodiment in the present disclosure can have a good thermal conductivity, so as to effectively dissipate heat generated by the light-emitting chip 2.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting diode package component, comprising:
    a substrate;
    a light-emitting chip disposed on the substrate for generating an initial light beam with an initial wavelength;
    a die attach adhesive disposed between the light-emitting chip and the substrate, wherein the light-emitting chip is mounted on the substrate by the die attach adhesive; and
    a molding layer covering the light-emitting chip;
    wherein the die attach adhesive includes a first wavelength conversion material, a portion of the initial light beam that enters into the die attach adhesive excites the first wavelength conversion material to produce an excitation light with a first wavelength, the excitation light is reflected back to the light-emitting chip by the substrate and then enters into the molding layer, and the first wavelength is greater than the initial wavelength;
    wherein a particle size of the first wavelength conversion material ranges from 5 μm to 20 μm.

2. The light-emitting diode package component according to claim 1, wherein the molding layer includes a second wavelength conversion material, and another portion of the initial light beam that directly enters into the molding layer excites the second wavelength conversion material to output an emission light, and the emission light is a mixed light.

3. The light-emitting diode package component according to claim 2, wherein the second wavelength conversion material includes green phosphor and red phosphor.

4. The light-emitting diode package component according to claim 1, wherein the first wavelength conversion material includes at least one of phosphor and quantum dots.

5. The light-emitting diode package component according to claim 1, wherein the excitation light is green light, and the first wavelength ranges from 515 nm to 570 nm.

6. The light-emitting diode package component according to claim 1, wherein the die attach adhesive has a thickness ranging from 5 to 20 μm, and a ratio of the particle size of the first wavelength conversion material to the thickness of the die attach adhesive ranges from 0.25 to 1.

7. The light-emitting diode package component according to claim 1, wherein the light-emitting chip is a blue light-emitting chip, the initial wavelength ranges from 420 nm to 470 nm.

8. The light-emitting diode package component according to claim 1, wherein the first wavelength conversion material is selected from a group consisting of nitride phosphor, β-SiAlON phosphor, α-SiAlON phosphor, lutetium aluminum garnet (LuAG) phosphor, yttrium aluminum gallium garnet (GaYAG) phosphor, yttrium aluminum garnet (YAG) phosphor, lutetium and yttrium aluminum garnet (LuYAG) phosphor, and any combination thereof.

9. The light-emitting diode package component according to claim 1, wherein the light-emitting chip is a violet light-emitting chip, the initial wavelength ranges from 380 nm to 420 nm.

10. The light-emitting diode package component according to claim 9, wherein the first wavelength conversion material is selected from a group consisting of nitride phosphor, β-SiAlON phosphor, α-SiAlON phosphor, halophosphate phosphor, and any combination thereof.

11. The light-emitting diode package component according to claim 1, wherein the die attach adhesive includes a matrix, the first wavelength conversion material is embedded in the matrix, and the matrix is made of methyl silicone resin.

12. The light-emitting diode package component according to claim 1, wherein the molding layer has a light emergent surface, and the light emergent surface is flush with a top surface of the reflective structure.

13. The light-emitting diode package component according to claim 1, wherein the substrate has a reflective surface and a die-bonding region that is defined on the reflective surface, and the light-emitting chip is disposed in the die-bonding region.

14. The light-emitting diode package component according to claim 1, further comprising a reflective structure disposed on the substrate and surrounding the light-emitting chip, wherein the reflective structure defines an accommodating space, and the molding layer fills in the accommodating space.

15. The light-emitting diode package component according to claim 1, wherein the first wavelength conversion material is the green phosphor, and the die attach adhesive includes 100-300 wt % of the green phosphor.

16. The light-emitting diode package component according to claim 1, wherein the first wavelength conversion material is the red phosphor, and the die attach adhesive includes 10-60 wt % of the red phosphor.

* * * * *